US012618910B2

(12) United States Patent
Bhaskar et al.

(10) Patent No.: US 12,618,910 B2
(45) Date of Patent: May 5, 2026

(54) METHOD AND SYSTEM FOR OPERATING A SENSOR DEVICE

(71) Applicant: ABB Schweiz AG, Baden (CH)

(72) Inventors: Reddy Nili Bhaskar, Bangalore (IN); Appadurai Balaji, Bangalore (IN); V N Pranathy, Bangalore (IN)

(73) Assignee: ABB Schweiz AG, Baden (CH)

( * ) Notice: Subject to any disclaimer, the term of this patent is extended or adjusted under 35 U.S.C. 154(b) by 135 days.

(21) Appl. No.: 18/442,542

(22) Filed: Feb. 15, 2024

(65) Prior Publication Data

US 2024/0280639 A1 Aug. 22, 2024

(30) Foreign Application Priority Data

Feb. 16, 2023 (IN) .............................. 202341010459

(51) Int. Cl.
| | |
|---|---|
| *G01N 27/416* | (2006.01) |
| *G01R 31/382* | (2019.01) |
| *H02J 7/00* | (2006.01) |
| *H10N 10/13* | (2023.01) |
| *H02J 7/34* | (2006.01) |

(52) U.S. Cl.
CPC .......... *G01R 31/382* (2019.01); *H02J 7/0048* (2020.01); *H10N 10/13* (2023.02); *H02J 7/345* (2013.01)

(58) Field of Classification Search
CPC ...... G01R 31/382; H02J 7/0048; H02J 7/345; H02J 50/001; H10N 10/13
See application file for complete search history.

(56) References Cited

U.S. PATENT DOCUMENTS

| | | | | |
|---|---|---|---|---|
| 10,931,135 B2 * | 2/2021 | Lazaro | ...................... | H02J 7/34 |
| 11,251,316 B2 * | 2/2022 | Harris | ................... | H02J 7/0068 |
| 2004/0078662 A1 * | 4/2004 | Hamel | ................... | H02N 2/186 |
| | | | | 714/22 |
| 2012/0256492 A1 * | 10/2012 | Song | ....................... | H02J 1/102 |
| | | | | 307/64 |
| 2016/0294184 A1 * | 10/2016 | Al-Atat | .................... | H02J 7/34 |
| 2019/0305583 A1 | 10/2019 | Tanaka et al. | | |
| 2020/0303952 A1 * | 9/2020 | La Rosa | ................. | H04Q 9/00 |

FOREIGN PATENT DOCUMENTS

| | | |
|---|---|---|
| CN | 112260380 A | 1/2021 |
| WO | WO 2017/161026 A1 | 9/2017 |
| WO | WO 2021/211593 A1 | 10/2021 |

OTHER PUBLICATIONS

European Patent Office, Extended European Search Report in European Patent Application No. 24158066.1, 14 pp. (Jun. 25, 2024).

* cited by examiner

*Primary Examiner* — Thang X Le
(74) *Attorney, Agent, or Firm* — Fitch Even Tabin & Flannery LLP

(57) ABSTRACT

A system and method for operating a sensor device includes generating an electrical energy corresponding to a heat dissipated from a surface of an equipment, regulating the electrical energy to generate an optimum output voltage using a maximum power point tracking technique and feeding the optimum output voltage to charge an energy storage device, triggering a sensor device to acquire sensor data when a charge stored in the energy storage device is equal to or greater than a pre-defined threshold value, and transmitting the sensor data to a receiving device.

14 Claims, 3 Drawing Sheets

METHOD AND SYSTEM FOR OPERATING A SENSOR DEVICE

CROSS-REFERENCE TO RELATED APPLICATIONS

The instant application claims priority to Indian Patent Application No. 202341010459, filed Feb. 16, 2023, which is incorporated herein in its entirety by reference.

FIELD OF THE DISCLOSURE

The present disclosure generally relates to a sensor device and, more particularly, to a method and a system for operating a sensor device.

BACKGROUND OF THE INVENTION

Electrical systems comprise of equipment and/or components such as cables, busbars, heat sinks, protective devices, static transfer switches, power cable joints, one or more transformers, and the like. In such electrical systems, there exists hot spots that are at relatively high temperature in comparison to its surroundings. Conventionally, these hot spots are measured using thermocouples. However, the use of thermocouples and associated wiring harness becomes complicated to manage within the electrical systems. To overcome such problems, temperature sensors with a battery are utilized. However, the battery-operated temperature sensors have the problem of replacing the battery at periodic intervals, which may not be an efficient and safe method to carry out in the electrical systems. As a consequence, there is a need for an improved operating mechanism of a sensor device.

The information disclosed in this background of the disclosure section is only for enhancement of understanding of the general background of the invention and should not be taken as an acknowledgement or any form of suggestion that this information forms the prior art already known to a person skilled in the art.

BRIEF SUMMARY OF THE INVENTION

In an embodiment, the present disclosure provides a method for operating a sensor device. The method comprising generating an electrical energy corresponding to a heat dissipated from a surface of an equipment. Thereafter, the method comprises regulating the electrical energy to generate an optimum output voltage using a maximum power point tracking technique and feeding the optimum output voltage to charge an energy storage device. Subsequently, the method comprises triggering a sensor device to acquire sensor data when a charge stored in the energy storage device is equal to or greater than a pre-defined threshold value.

In another embodiment, the present disclosure provides a system for operating a sensor device. The system comprising a thermoelectric generating module, a power managing module, and controlling module. The thermoelectric generating module is configured to generate an electrical energy corresponding to a heat dissipated from a surface of an equipment. The power managing module, electrically coupled to the thermoelectric generating module, is configured to regulate the electrical energy to generate an optimum output voltage using a maximum power point tracking technique and feed the optimum output voltage to charge an energy storage device. The controlling module, electrically coupled to the power managing module and the sensor device, is configured to trigger a sensor device to acquire sensor data when a charge stored in the energy storage device is equal to or greater than a pre-defined threshold value.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE SEVERAL VIEWS OF THE DRAWING(S)

The novel features and characteristics of the disclosure are set forth in the appended claims. The disclosure itself, however, as well as a preferred mode of use, further objectives and advantages thereof, will best be understood by reference to the following detailed description of an illustrative embodiment when read in conjunction with the accompanying figures. One or more embodiments are now described, by way of example only, with reference to the accompanying figures wherein like reference numerals represent like elements.

Figure 1:
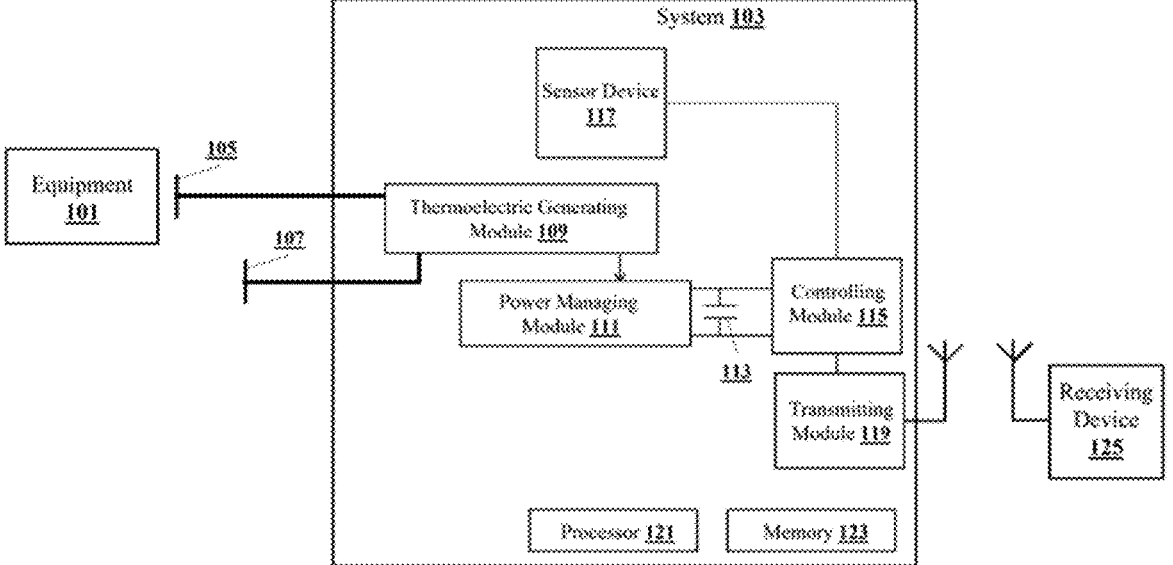
FIG. 1 illustrates an exemplary environment for operating a sensor device in accordance with some embodiments of the present disclosure.

It should be appreciated by those skilled in the art that any block diagram herein represents conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION OF THE INVENTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternatives falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

An embodiment of the present disclosure provides a solution for operating a sensor device. The present disclosure discloses a method, and a system for operating the sensor device. The sensor device may be a wireless sensor device or a wired sensor device. The method of the present disclosure involves generating an electrical energy corresponding to a heat dissipated from a surface of an equipment and regulating the electrical energy to generate an optimum output voltage using a maximum power point tracking technique. Thereafter, the method involves feeding the optimum output voltage to charge an energy storage device. The method involves triggering a sensor device to acquire sensor data when a charge stored in the energy storage device is equal to or greater than a pre-defined threshold value. The sensor data relates to ambient data (i.e., temperature and/or humidity data) acquired from the vicinity of the equipment. This approach (1) overcomes the need for a power supply or a battery to operate the sensor device, (2) overcomes the use of wiring harness associated with thermocouples typically found in conventional temperature sensing system, and (3) provides an efficient and safe method to carry out sensing measurements in electrical systems by advertising sensor data such as temperature and/or humidity data automatically and wirelessly in real-time to a receiving device such as a smart phone, a laptop, a computer system and the like.

FIG. 1 illustrates an exemplary environment for operating a sensor device in accordance with some embodiments of the present disclosure.

As shown in FIG. 1, the environment includes an equipment 101, a system 103 of the present disclosure, and a receiving device 125. The equipment 101 is, not limited to, one of a busbar, a heat sink, a power cable joint, and a transformer. The system 103 comprises two terminals 105, 107 (also, referred as Input/Output (I/O) interface), a processor 121 and a memory 123. One terminal 105 of the system 103 is positioned close to the surface of the equipment 101 and another terminal 107 of the system 103 is at an ambient temperature, as shown in the FIG. 1. The two terminals 105, 107 may be two wires of different materials or two wires of same material. The system 103 measures the difference in heat energy between the two terminals 105, 107 to generate an electrical energy (i.e., voltage). The system 103 comprises an energy storage device 113 to store charge. The energy storage device 113 is, not limited to, one of a super-capacitor or a rechargeable battery. In one embodiment, the system 103 comprises a sensor device 117 to acquire sensor data relating to ambient data or equipment 101 surface data, as shown in FIG. 1. The sensor device 117 may be a wireless sensor device or a wired sensor device. The sensor data is, not limited to, at least one of temperature data and humidity data. In another embodiment, the sensor device 117 is external to the system 103 to acquire sensor data and not part of the system 103. In such an embodiment, the sensor device 117 is electrically coupled to the system 103. The sensor device 117 is placed in the vicinity of the equipment 101 to acquire the sensor data. The system 103 transmits sensor data to the receiving device 125. The receiving device 125 may be, not limited to, a portable computing device or a stationary computing device. The system 103 transmits sensor data to the receiving device 125 by employing short and/or long range communication protocols/methods such as, without limitation, infrared, Radio Frequency (RF) antennas, Bluetooth, cellular e.g., Code Division Multiple Access (CDMA), High Speed Packet Access (HSPA+), Global System for Mobile communications (GSM®), Long Term Evolution (LTE®), Worldwide interoperability for Microwave access (WiMax®), or the like.

The memory 123 of the system 103 is communicatively coupled to the processor 121 of the system 103. The memory 123 stores processor instructions which cause the processor 121 to execute the instructions for operating a sensor device 117.

The processor 121 includes at least one data processor for operating the sensor device 117.

Hereafter, the operation of the system 103 for operating the sensor device 117 is described.

The equipment 101 such as, but not limited to, a busbar, a heat sink, a power cable joint, and a transformer, tend to dissipate heat. In general, the equipment 101 can be any instrument/equipment that has a tendency to dissipate heat. The system 103 generates an electrical energy corresponding to the heat dissipated from a surface of the equipment 101. In detail, the system 103 measures difference in heat energy between two terminals 105, 107 of the system 103 and generates the electrical energy based on the difference in the heat energy between the two terminals 105, 107. In one embodiment, the generation of the electrical energy based on the difference in the heat energy between the two terminals 105, 107 is using, but not limited to, Seebeck effect. Thereafter, the system 103 regulates the electrical energy to generate an optimum output voltage using a Maximum Power Point Tracking (MPPT) technique. The MPPT technique is a method of adjusting load characteristics to ensure highest transfer of power at given conditions of an energy source. In detail, as the electrical energy varies due to change in the difference in heat energy, the system 103 using the MPPT technique regulates/adjusts the charging voltage and current to extract a maximum available power by constantly adjusting an impedance of a thermoelectric generating module (discussed in below section) of the system 103 to match an impedance of the sensor device 117 and a transmitting module (discussed in below section) of the system 103. The optimum output voltage refers to a voltage needed to charge the energy storage device 113 at the maximum available power from the thermoelectric generating module. The system 103 feeds the optimum output voltage to charge the energy storage device 113. When a charge stored in the energy storage device 113 is equal to or greater than a pre-defined threshold value, the system 103 triggers the sensor device 117 to acquire sensor data. In details, the system 103 determines an amount of energy from the charge stored in the energy storage device 113. Subsequently, the system 103 determines an energy required for acquiring the sensor data and for transmitting the sensor data to the receiving device 125. When the amount of energy is equal to or greater than the energy required for acquiring the sensor data and transmitting the sensor data to the receiving device 125, the system 103 triggers the sensor device 117 to acquire the sensor data. Lastly, the system 103 transmits the sensor data to the receiving device 125 for displaying the sensor data or for further analysis of the sensor data.

Figure 2:
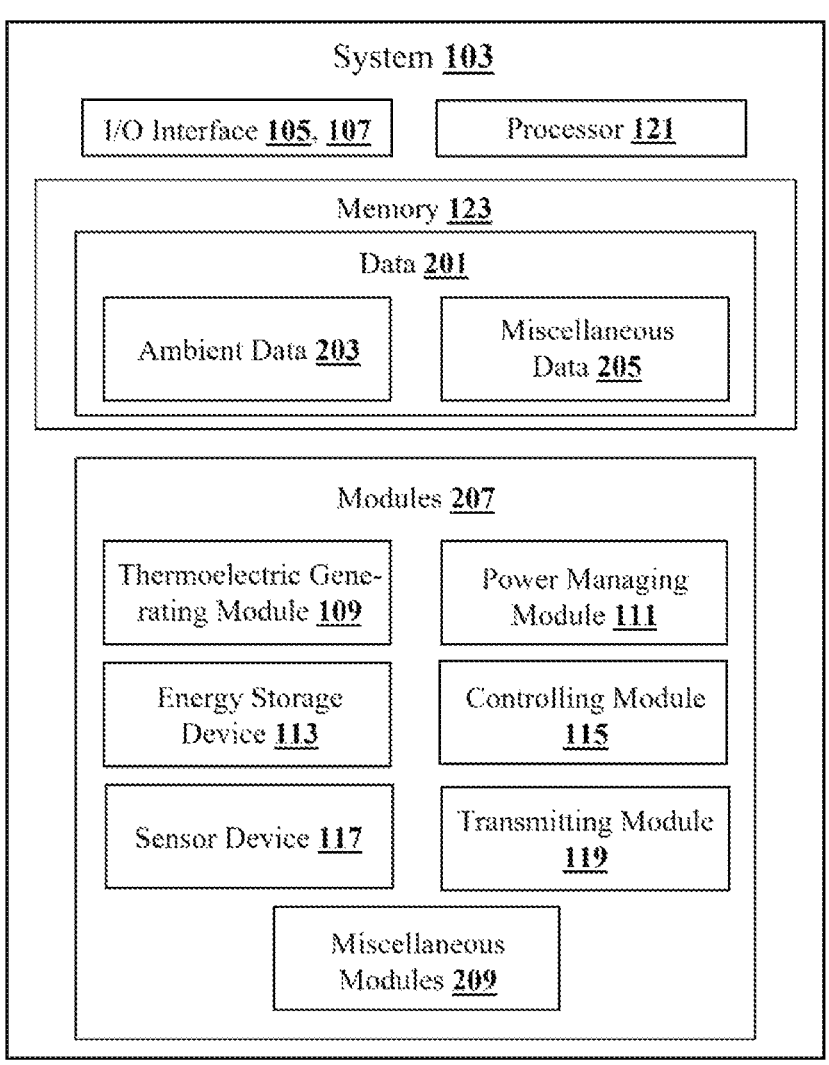
FIG. 2 shows a detailed block diagram of a system in accordance with some embodiments of the present disclosure.

FIG. 2 shows a detailed block diagram of a system in accordance with some embodiments of the present disclosure.

The system 103, in addition to the processor 121 and the memory 123 described above, includes an I/O interface 105, 107. The I/O interface 105, 107 is, also, referred as two terminals 105, 107 of the system 103. One terminal 105 of the system 103 is positioned close to the surface of the equipment 101 and the terminal 107 of the system 103 is at an ambient temperature, as shown in the FIG. 1. The terminal 107 is positioned such that the terminal 107 is at the ambient temperature. The two terminals 105, 107 may be two wires of different materials or two wires of same material and a difference in heat energy of the two terminals 105, 107 is measured.

The system 103, in addition to the I/O interface 105, 107, includes data 201 and one or more modules 207, which are described herein in detail. In an embodiment, the data 201 is stored within the memory 123. The data 201 includes, for example, ambient data 203, and miscellaneous data 205.

The ambient data 203 includes, not limited to, at least one of temperature data and humidity data acquired from the vicinity of the equipment 101.

The miscellaneous data 205 may store data, including temporary data and temporary files, generated by one or more modules 207 for performing the various functions of the system 103.

In an embodiment, the data 201 in the memory 123 is processed by the one or more modules 207 of the system 103. The one or more modules 207 may be implemented as dedicated hardware units. As used herein, the term module refers to an Application Specific Integrated Circuit (ASIC), an electronic circuit, a Field Programmable Gate Arrays (FPGA), Programmable System on Chip (PSoC), a combinational logic circuit, and/or other suitable components that provide the described functionality. In some implementations, the one or more modules 207 are communicatively coupled to the processor 121 of the system 103 for performing one or more functions of the system 103. The one or more modules 207 when configured with the functionality defined in the present disclosure will result in a novel hardware. In another embodiment, the data 201 in the memory 123 is processed by the one or more modules 207 of the memory 123 of the system 103.

In one implementation, the one or more modules 207 include, but are not limited to, a thermoelectric generating module 109, a power managing module 111, an energy storage device 113, a controlling module 115, a sensor device 117, and a transmitting module 119. The one or more modules 207, also, include miscellaneous modules 209 to perform various miscellaneous functionalities of the system 103.

In one embodiment, the sensor device 117 is external to the system 103 and not part of the one or more modules 207 of the system 103. In such an embodiment, the sensor device 117 is electrically coupled to the controlling module 115 of the system 103.

The thermoelectric generating module 109 is configured to generate an electrical energy corresponding to a heat dissipated from a surface of the equipment 101. In detail, the thermoelectric generating module 109 is configured to measure difference in heat energy between two terminals 105, 107 of the system 103. One terminal 105 of the system 103 is positioned close to the surface of the equipment 101 and the terminal 107 of the system 103 is at an ambient temperature. Thereafter, the thermoelectric generating module 109 is configured to generate the electrical energy based on the difference in the heat energy between the two terminals 105, 107 of the system 103. In one embodiment, the generation of electrical energy from the difference in the heat energy between the two terminals 105, 107 is using, but not limited to, Seebeck effect. The equipment 101 is, but not limited to, one of a busbar, a heat sink, a power cable joint, and a transformer. In one embodiment, the thermoelectric generating module 109 is a Thermoelectric Generator (TEG) device.

The power managing module 111 is electrically coupled to the thermoelectric generating module 109. The power managing module 111 is configured to regulate the electrical energy to generate an optimum output voltage using a maximum power point tracking (also, referred as power point tracking) technique. Thereafter, the power managing module 111 is configured to feed the optimum output voltage to charge the energy storage device 113. In one embodiment, the power managing module 111 is a Maximum Power Point Tracking (MPPT) Direct Current (DC) to DC converter.

The energy storage device 113 is electrically coupled to the power managing module 111 and the controlling module 115. The energy storage device 113 is configured to store charge. The energy storage device 113 is, not limited to, one of a super-capacitor or a rechargeable battery. In one embodiment, the system 103 may comprises more than one super-capacitor or rechargeable battery to store charge.

The controlling module 115 is electrically coupled to the power managing module 111 and the sensor device 117. The controlling module 115 is configured to trigger the sensor device 117 to acquire sensor data when a charge stored in the energy storage device 113 is equal to or greater than a pre-defined threshold value. In detail, the controlling module 115 is configured to determine an amount of energy from the charge stored in the energy storage device 113 and to determine an energy required for acquiring the sensor data and for transmitting the sensor data to a receiving device 125. Thereafter, the controlling module 115 is configured to trigger the sensor device 117 to acquire the sensor data when the amount of energy is equal to or greater than the energy required for acquiring the sensor data and transmitting the sensor data to the receiving device 125. In one embodiment, the controlling module 115 is a microcontroller or a Micro-programmed Control Unit (MCU).

The sensor device 117 is electrically coupled to the controlling module 115. The sensor device 117 is configured to acquire sensor data when the controlling module 115 triggers the sensor device 117. The sensor data is, not limited to, at least one of temperature data and humidity data. The sensor device 117 may be a wireless sensor device or a wired sensor device.

The transmitting module 119 is electrically coupled to the controlling module 115. The transmitting module 119 is configured to transmit the sensor data to the receiving device 125. The transmitting module 119 employs communication protocols/methods such as, without limitation, infrared, Radio Frequency (RF) antennas, Bluetooth, cellular e.g., Code Division Multiple Access (CDMA), High Speed Packet Access (HSPA+), Global System for Mobile communications (GSM®), Long Term Evolution (LTE®), Worldwide interoperability for Microwave access (WiMax®), or the like. The receiving device 125 may be a smart phone, a laptop, a computer system, and the like. The transmitting module 119 is a transmitter device that may be, but not limiting to, a radio transmitter, a Bluetooth transmitter, a cellular transmitter, and the like.

Figure 3:
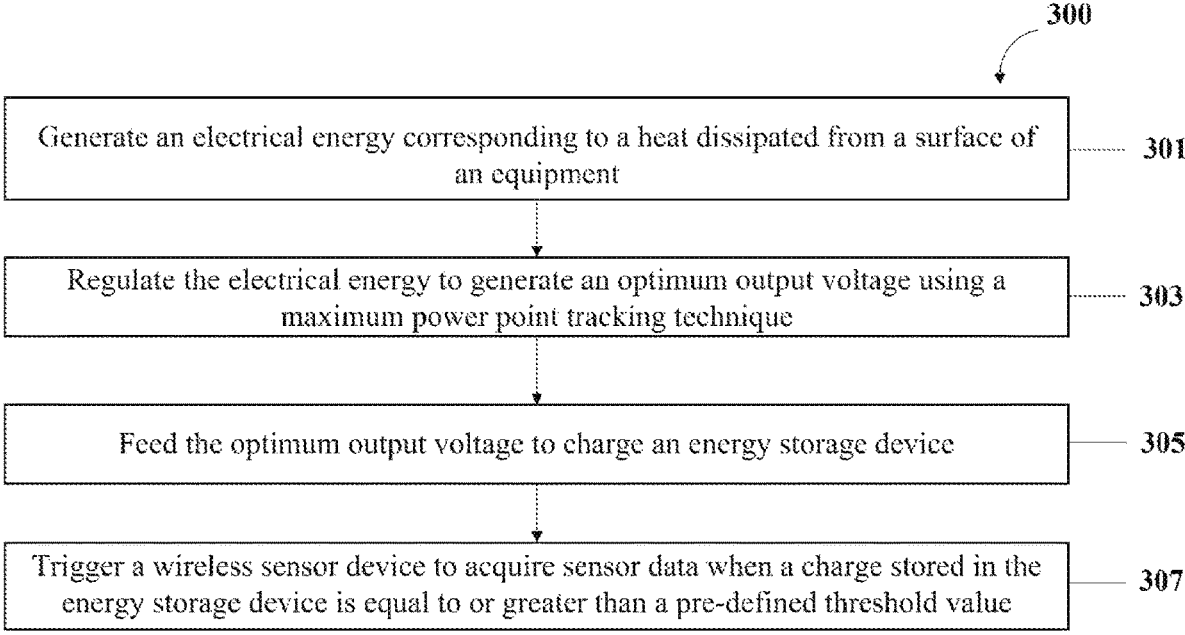
FIG. 3 illustrates a flowchart showing a method for operating a sensor device in accordance with some embodiments of present disclosure.

FIG. 3 illustrates a flowchart showing a method for operating a sensor device in accordance with some embodiments of present disclosure.

As illustrated in FIG. 3, the method 300 includes one or more blocks for operating a sensor device. The method 300 may be described in the general context of computer executable instructions. Generally, computer executable instructions can include routines, programs, objects, components, data structures, procedures, modules, and functions, which perform particular functions or implement particular abstract data types.

The order in which the method 300 is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At block 301, the thermoelectric generating module 109 of the system 103 generates an electrical energy corresponding to a heat dissipated from a surface of the equipment 101. The equipment 101 is one of a busbar, a heat sink, a power cable joint, and a transformer.

At block 303, the power managing module 111 of the system 103 regulates the electrical energy to generate an optimum output voltage using a maximum power point tracking technique.

At block 305, the power managing module 111 of the system 103 feeds the optimum output voltage to charge the energy storage device 113. The energy storage device 113 is one of a super-capacitor or a rechargeable battery.

At block 307, the controlling module 115 of the system 103 triggers the sensor device 117 to acquire sensor data when a charge stored in the energy storage device 113 is equal to or greater than a pre-defined threshold value. The sensor data is at least one of temperature data and humidity data.

Some of the advantages of the present disclosure are listed below.

The present disclosure overcomes the need for a power supply or a battery to operate the sensor device.

The present disclosure overcomes the use of wiring harness associated with thermocouples typically found in conventional temperature sensing system.

The present disclosure advertises sensor data such as temperature and/or humidity data automatically and wirelessly in real-time to a receiving device such as a smart phone, a laptop, a computer system, and the like based on the amount of energy from the charge stored in the energy storage device. This approach provides an efficient and safe method to carry out sensing measurements in electrical systems.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

| Referral Numerals: | |
| --- | --- |
| Referral Number | Description |
| 101 | Equipment |
| 103 | System |
| 105, 107 | Terminals |
| 109 | Thermoelectric generating module |
| 111 | Power managing module |
| 113 | Energy storage device |
| 115 | Controlling module |
| 117 | Sensor device |
| 119 | Transmitting module |
| 121 | Processor |
| 123 | Memory |
| 125 | Receiving device |
| 201 | Data |
| 203 | Ambient data |
| 205 | Miscellaneous data |
| 207 | One or more modules |
| 209 | Miscellaneous modules |

What is claimed is:

1. A method for operating a sensor device, the method comprising:
   generating, by a thermoelectric generating module, an electrical energy corresponding to a heat dissipated from a surface of an equipment;
   regulating, by a power managing module, the electrical energy to generate an optimum output voltage using a maximum power point tracking technique;
   feeding, by the power managing module, the optimum output voltage to charge an energy storage device;
   powering, by a controlling module, the sensor device using the energy storage device; and
   triggering, by the controlling module, the sensor device to acquire sensor data when a charge stored in the energy storage device is equal to or greater than a pre-defined threshold value.

2. The method as claimed in claim 1 further comprising transmitting the sensor data to a receiving device.

3. The method as claimed in claim 1, wherein the equipment is one of a busbar, a heat sink, a power cable joint, and a transformer.

4. The method as claimed in claim 1, wherein generating the electrical energy corresponding to the heat dissipated from the surface of the equipment comprises:
   measuring difference in heat energy between two terminals of a system, wherein one terminal of the system is positioned close to the surface of the equipment and another terminal of the system is at an ambient temperature; and
   generating the electrical energy based on the difference in the heat energy between the two terminals of the system.

5. The method as claimed in claim 1, wherein the energy storage device is one of a super-capacitor and a rechargeable battery.

6. The method as claimed in claim 1, wherein the sensor data is at least one of temperature data and humidity data.

7. The method as claimed in claim 1, wherein triggering the sensor device to acquire the sensor data when the charge stored in the energy storage device is equal to or greater than the pre-defined threshold value comprises:
   determining an amount of energy from the charge stored in the energy storage device;
   determining an energy required for acquiring the sensor data and for transmitting the sensor data to a receiving device; and
   triggering the sensor device to acquire the sensor data when the amount of energy is equal to or greater than the energy required for acquiring the sensor data and transmitting the sensor data to the receiving device.

8. A system for operating a sensor device, the system comprising:
   a thermoelectric generating module configured to generate an electrical energy corresponding to a heat dissipated from a surface of an equipment;
   a power managing module electrically coupled to the thermoelectric generating module, the power managing module configured to:
      regulate the electrical energy to generate an optimum output voltage using a maximum power point tracking technique; and
      feed the optimum output voltage to charge an energy storage device;
   a controlling module electrically coupled to the power managing module and the sensor device, the controlling module configured to power the sensor device using the energy storage device, and trigger the sensor device to acquire sensor data when a charge stored in the energy storage device is equal to or greater than a pre-defined threshold value.

9. The system as claimed in claim 8, further comprising a transmitting module electrically coupled to the controlling module, the transmitting module configured to transmit the sensor data to a receiving device.

10. The system as claimed in claim 8, wherein the equipment is one of a busbar, a heat sink, a power cable joint, and a transformer.

11. The system as claimed in claim 8, wherein the thermoelectric generating module is configured to:
   measure a difference in heat energy between two terminals of the system, wherein one terminal of the system is positioned close to the surface of the equipment and another terminal of the system is at an ambient temperature; and
   generate the electrical energy based on the difference in the heat energy between the two terminals of the system.

12. The system as claimed in claim 8, wherein the energy storage device is one of a super-capacitor or a rechargeable battery.

13. The system as claimed in claim 8, wherein the sensor data is at least one of temperature data and humidity data.

14. The system as claimed in claim 8, wherein the controlling module is configured to:
   determine an amount of energy from the charge stored in the energy storage device;
   determine an energy required for acquiring the sensor data and for transmitting the sensor data to a receiving device; and
   trigger the sensor device to acquire the sensor data when the amount of energy is equal to or greater than the energy required for acquiring the sensor data and transmitting the sensor data to the receiving device.

* * * * *